United States Patent [19]

Ueda et al.

[11] 4,244,000
[45] Jan. 6, 1981

[54] PNPN SEMICONDUCTOR SWITCHES

[75] Inventors: Jun Ueda; Haruo Mori; Kazuo Hagimura, all of Tokyo; Kotaro Kato, Chofu, all of Japan

[73] Assignees: Nippon Telegraph and Telephone Public Corporation; Oki Electric Industry Company, Ltd., both of Tokyo, Japan

[21] Appl. No.: 96,165

[22] Filed: Nov. 20, 1979

[30] Foreign Application Priority Data

Nov. 28, 1978 [JP] Japan .................... 53/146058

[51] Int. Cl.³ .......................... H01L 29/747
[52] U.S. Cl. ........................ 357/39; 357/23; 357/30; 357/38; 357/51; 357/54; 357/58; 357/59; 357/86
[58] Field of Search ............ 357/30, 38, 39, 51, 357/59, 86, 54, 58, 23

[56] References Cited

U.S. PATENT DOCUMENTS 3,832,732  8/1974  Roberts .................... 357/39

FOREIGN PATENT DOCUMENTS 2040657  2/1972  Fed. Rep. of Germany ......... 357/38
2558626  7/1976  Fed. Rep. of Germany ......... 357/38

Primary Examiner—Joseph E. Clawson, Jr.
Attorney, Agent, or Firm—Wenderoth, Lind & Ponack

[57] ABSTRACT

A circuit for preventing a dV/dt erroneous operation of a PNPN semiconductor switch is replaced by a capacitance on the surface of a semiconductor substrate, a high resistance gate electrode. In other words, such a circuit is formed on the surface of the substrate by a slight modification of the basic design without decreasing the chip area and without isolating component elements.

10 Claims, 8 Drawing Figures

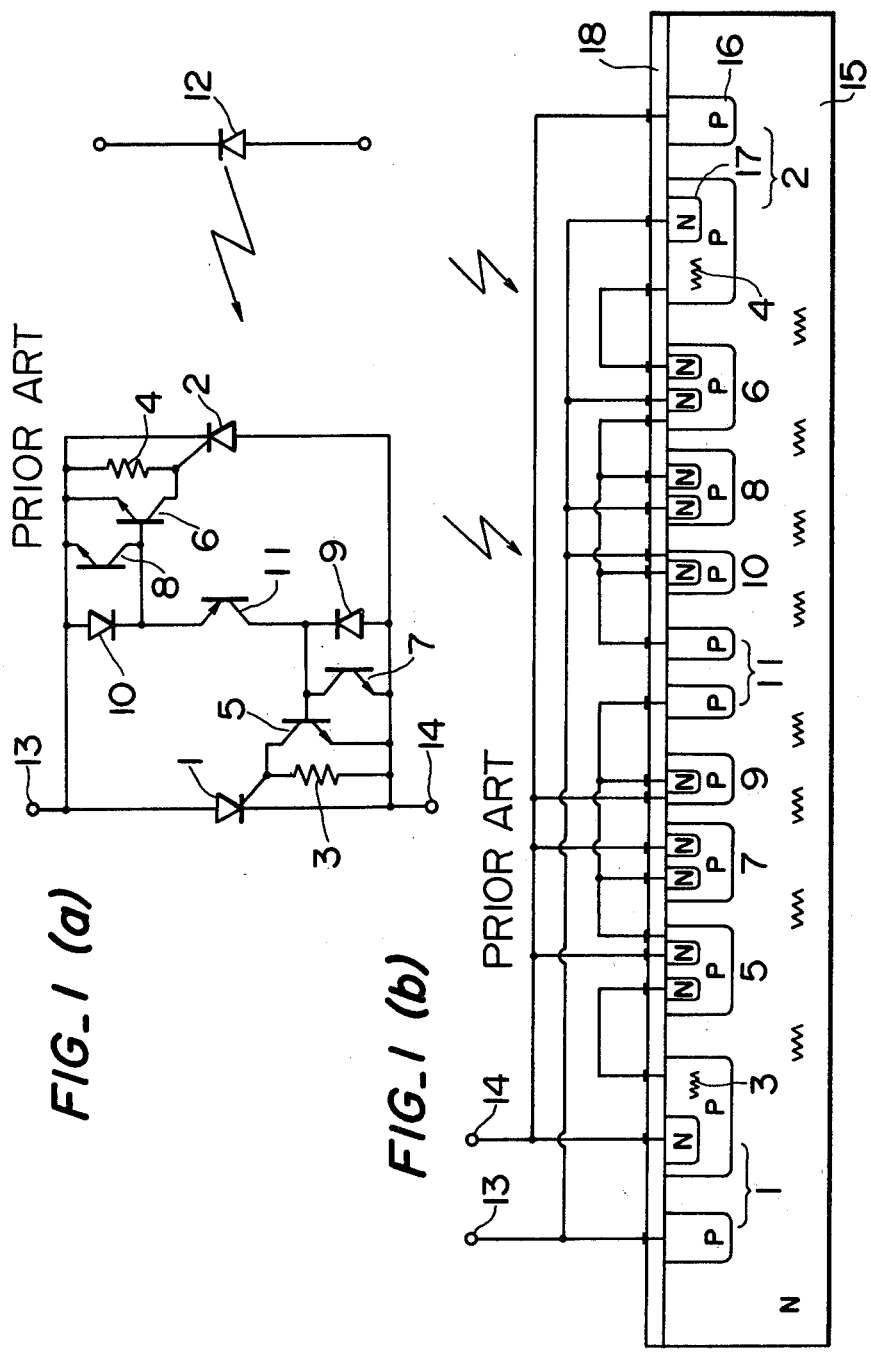
FIG_1 (a) PRIOR ART
FIG_1 (b) PRIOR ART

FIG_2  PRIOR ART
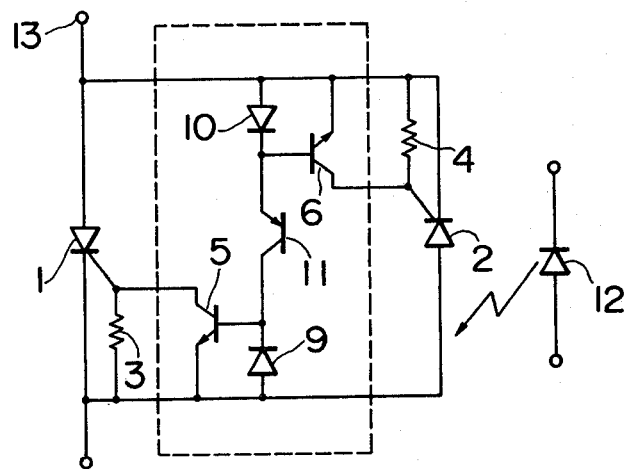
FIG_3  PRIOR ART
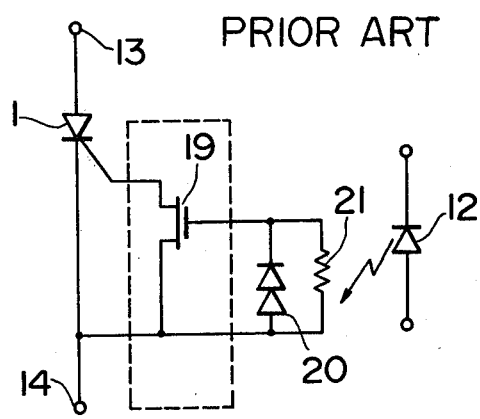

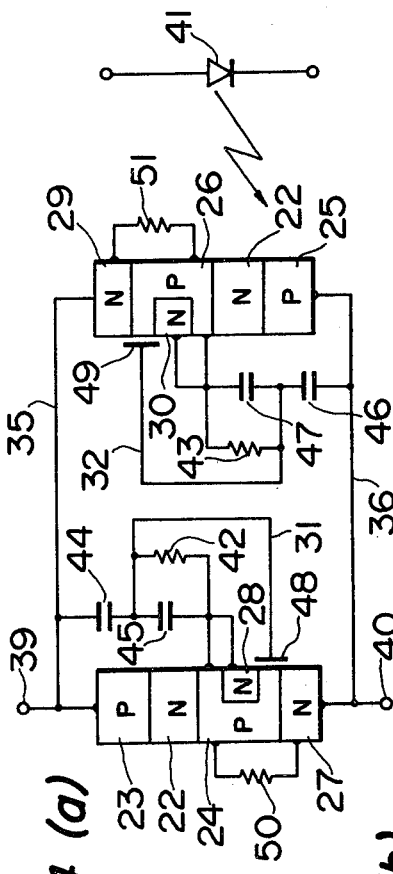
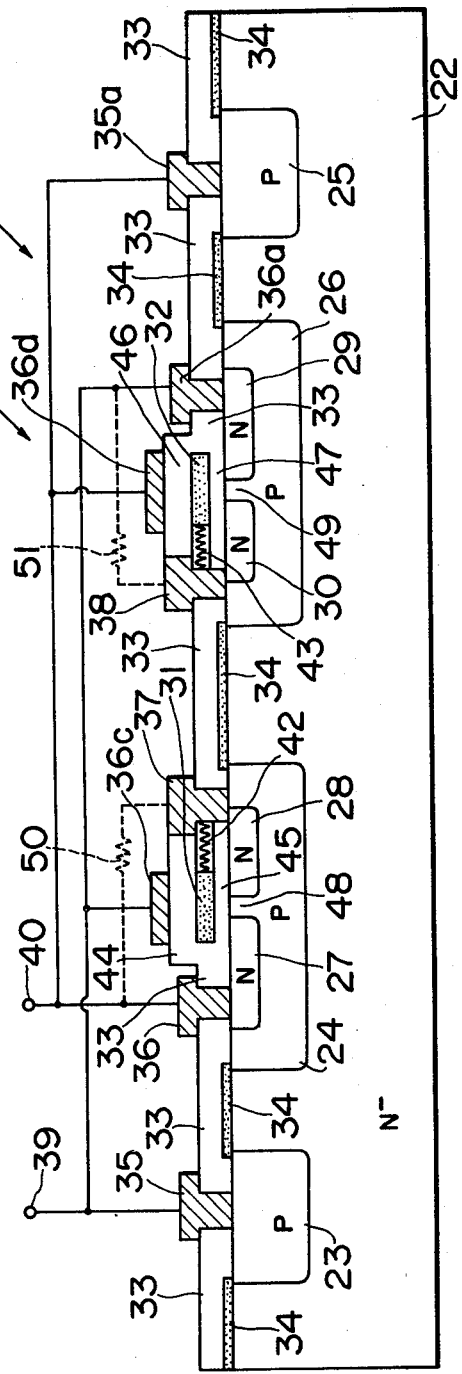
FIG_4 (a)
FIG_4 (b)

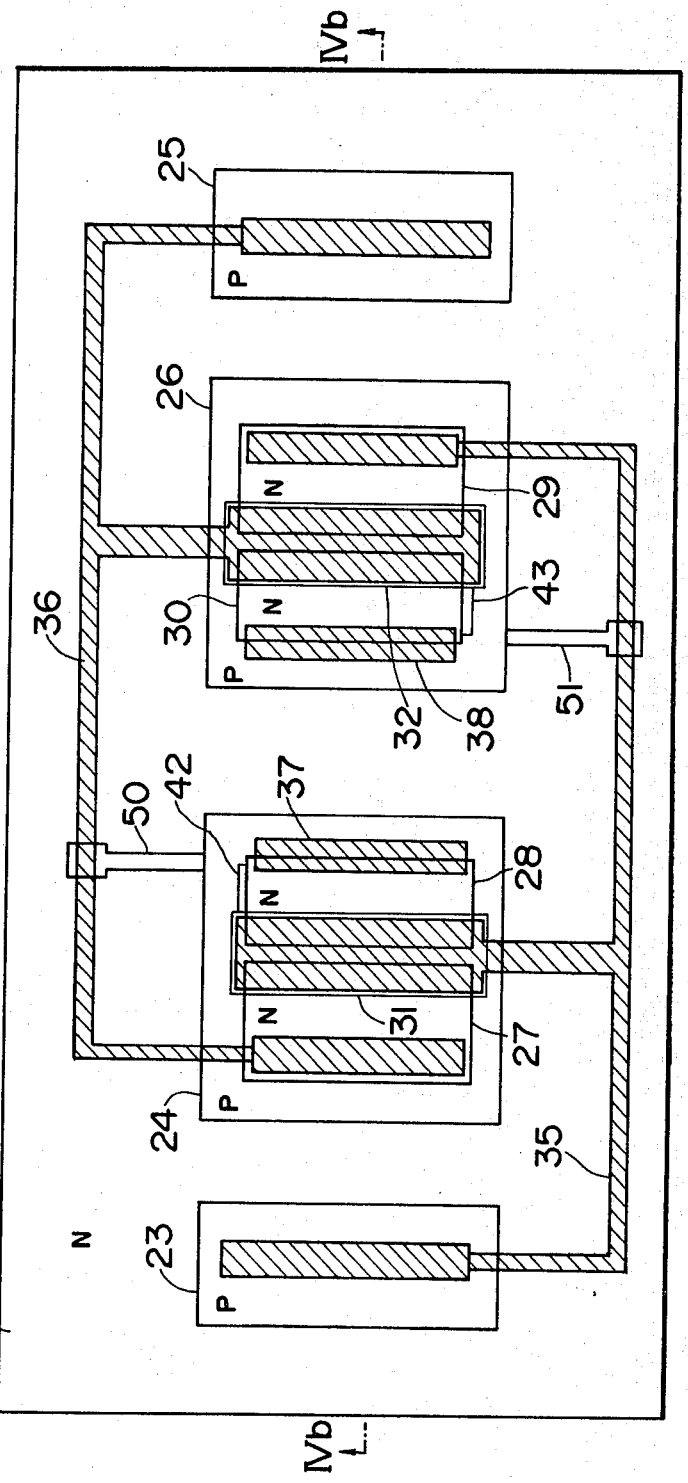
FIG_4 (c)

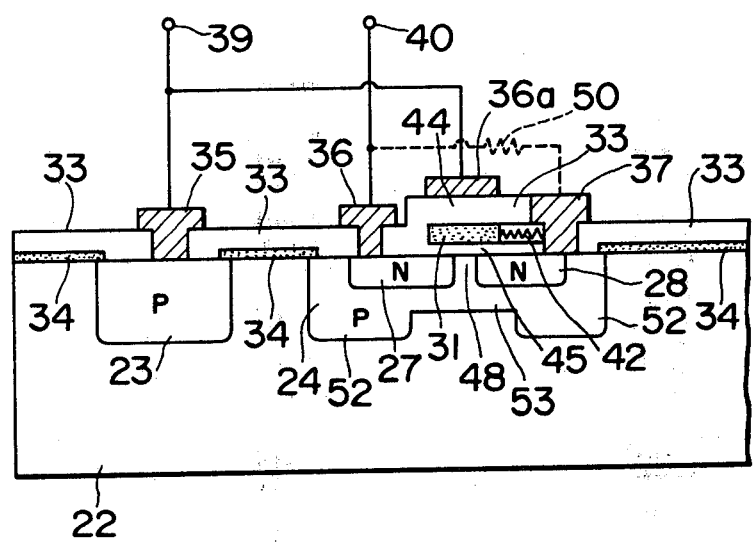
FIG_5

PNPN SEMICONDUCTOR SWITCHES

BACKGROUND OF THE INVENTION

This invention relates to a PNPN semiconductor switch having a high sensitivity, a dV/dt erroneous operation preventing capability and a small element area, but not requiring isolation of the elements to provide a light shield when the switch is driven by light to act as a bidirectional switch. The term "dV/dt erroneous operation preventing capability" is used herein to mean a limit of a misoperation (unwanted switching operation of the PNPN element) caused by transient current created in the element when a rapidly varying voltage is impressed between the anode and cathode electrodes of the element.

The connection and element construction of a prior art light driven PNPN semiconductor switch incorporating a dV/dt erroneous operation preventing circuit are shown by FIGS. 1a and 1b respectively, which show a bidirectional switch including two PNPN semiconductor elements connected in opposition. The circuit shown in FIG. 1a comprises PNPN semiconductor elements 1 and 2, resistors 3 and 4, NPN transistors 5, 6, 7 and 8, diodes 9 and 10, a PNP transistor 11, a luminous diode 12 and terminals 13 and 14, which are connected as shown. As shown in FIG. 1b the switching element comprises a high resistance N type substrate 15, P type diffused layers 16, N type diffused layers 17 and an insulating film 18, the diffused layers being connected by surface wiring as shown in FIG. 1a. As shown in FIG. 1b, various elements contained in the substrate are spaced from each other by sufficiently large spacings, and the luminous diode 12 shown in FIG. 1a is disposed to illuminate the entire circuit.

In the circuit shown in FIG. 1a, it is now assumed that the potential of terminal 13 is higher than that of terminal 14. When a voltage which builds up rapidly is applied to the PNPN semiconductor element 1, in the absence of an erroneous operation preventing circuit, it will misoperate due to transient current generated in the element. With the circuit shown in FIG. 1a, however, transient current also simultaneously occurs in the PNP transistor 11 having a high breakdown voltage and this transient current acts as the base current of the NPN transistor 5, thus causing it to become saturated. For this reason, the collector-emitter voltage of transistor 5 is clamped to a small value so that the transient current in the PNPN semiconductor element 1 flows through the transistor 5 to prevent the gate-cathode voltage of the PNPN semiconductor element 1 from building up, thus preventing erroneous operation of the PNPN semiconductor element 1.

When the luminous element 12 is actuated at a time when the potential of the terminal 13 is higher than that of 14, the PNPN semiconductor element 1 would be turned ON. Thus, upon operation of the luminous element 12, photocurrent flows through the PNP transistor 11 as well as through the PNPN semiconductor element 1. If the photocurrent saturates the transistor 5, the PNPN semiconductor element 1 would not be turned ON; however, since the NPN transistor 7 is also driven by light to clamp the base-emitter voltage f the transistor 5, the photocurrent in the PNP transistor 11 also flows through transistor 7 with the result being that the gate-cathode voltage of the PNPN semiconductor element 1 will not be clamped, thereby turning ON the PNPN semiconductor element 1. While the photosensitivity at this time is determined by the resistance 3 connected between the gate and cathode electrodes of the element 1, the photosensitivity is lowered by the loss of the photocurrent through the PNPN semiconductor element 1 caused by the photocurrent generated at the collector junction of the NPN transistor 5 at the time of light irradiation. In the circuit shown in FIG. 1, the diode 9 acts as a voltage stabilizing element.

When the potential of terminal 14 is higher than that of the terminal 13, the same operation is performed by reading the PNPN element 1 as the PNPN element 2, resistor 3 as resistor 4, the NPN transistor 5 as NPN transistor 6, the NPN transistor 7 as NPN transistor 8 and the diode 9 as diode 10.

With the prior art PNPN switching element, it has been possible to obtain a high dV/dt durability without substantially decreasing the photosensitivity of the PNPN semiconductor element and also to receive the light from the luminous element by the entire surface of the element. Where a bidirectional switch is formed on a single monocrystalline substrate as shown in FIG. 1b, the N gates of the two PNPN elements, the base electrode of transistor 11 and so forth would have the same potential. This does not cause any trouble in a bidirectional switch and when the current flowing between these elements can be made small by high resistance, no trouble occurs, thus allowing the fabrication of two switch elements on the same substrate. If one tries to form two bidirectional switches on the same substrate or where the switch is used in the case where the base of a PNP transistor, such as transistor 11, should not have the same potential as the N gate of the PNPN element, it would become impossible to fabricate two switching elements on the same substrate. In such a case, it is necessary to separate the elements. In other words, where a bidirectional switch is formed on a single high resistance substrate, it is not necessary to separate two switching elements. However, as the number of the elements is large, and as it is necessary to sufficiently separate the elements, the chip area becomes large thus not only making it difficult to fabricate a plurality of switching elements on the same substrate but also decreasing the yield of satisfactory products. There has also been proposed a method in which various elements are perfectly isolated by surrounding them with dielectric films for the purpose of preventing interaction between elements instead by remotely separating the elements as shown in FIG. 1b. This method is called dielectric separating method. This method, however, is defective in that, as the number of the elements is large and as it is necessary to sufficiently separate respective elements, the chip area increases so that this method is not suitable for large scale integration techniques and its yield is low. There has also been proposed a construction in which the NPN transistors 7 and 8 are omitted and transistors 5, 6 and 11 and diodes 9 and 10 are shielded against light. However, in a case of using a single substrate, it is difficult to shield it from light and such construction requires a dielectric isolation structure and a light shield must be provided as shown in FIG. 2. More particularly, with the construction shown in FIG. 1 it is necessary to illuminate only one given element since the silicon substrate cannot perfectly shield light, and the light projected upon one PNPN element would leak to the other element through the substrate. With the dielectric isolation structure, the dielectric films surrounding respective PNPN elements form a plurality of light reflective interfaces which prevent leakage of light.

Another PNPN semiconductor switch has also been proposed wherein a normally ON type field effect transistor is connected across the gate and cathode electrode of the PNPN element as shown in FIG. 3 (showing only one half of the circuit). The circuit shown in FIG. 3 comprises a field effect transistor 19, diodes 20, a resistor 21 and a luminous diode 12 which are connected as shown. When the luminous element is not operated, the resistance between the gate and cathode electrode of the PNPN element is low, its sensitivity is low and dV/dt durability is high. However, when the luminous element 12 is operated to effect photodrive, the resistance between the gate and cathode element becomes high and the sensitivity increases. This construction also requires element isolation and photoshield and cannot appreciably reduce the chip area.

SUMMARY OF THE INVENTION

It is an object of this invention to provide an improved PNPN semiconductor switch element capable of obviating various defects mentioned above.

Another object of this invention is to provide a novel PNPN semiconductor switch element which has a high gate sensitivity and a high dV/dt durability, can greatly reduce the chip area and does not require element isolation and a light shield.

According to this invention, there is provided a PNPN semiconductor switch comprising (a) an N conductivity type semiconductor substrate, (b) a P conductivity type P gate region, (c) a P conductivity type anode region formed in the semiconductor substrate at a position which is a predetermined distance from the P gate region, (d) an N conductivity type cathode region formed in the P gate region, (e) an N conductivity type drain region formed in the P gate region at a position which is spaced from the N conductivity type cathode region, (f) a first insulating layer formed on the surface of the substrate between the cathode region and the drain region, (g) a first gate electrode formed on the first gate insulating layer, (h) a second gate insulating layer formed on the first gate electrode, (i) a third insulating layer formed on the surface of the substrate between the anode region and the P gate region, (j) a P gate electrode electrically connected to the drain region and the P gate region, (k) a resistance region connected between the first gate electrode and the P gate electrode, (l) a second gate electrode mounted on the second gate insulating layer, (m) a cathode electrode electrically connected to the cathode region and (n) an anode electrode electrically connected to the anode region.

A bidirectional PNPN semiconductor switch can be fabricated on the same N type substrate by symmetrically arranging identical elements described above.

BRIEF DESCRIPTION OF THE DRAWINGS

In the accompanying drawings:

FIG. 1a is a connection diagram showing a prior art photo PNPN semiconductor switch;

FIG. 1b is a sectional view of the switch shown in FIG. 1a;

FIGS. 2 and 3 also show prior art PNPN semiconductor switches;

FIG. 4a is an equivalent circuit showing one embodiment of this invention;

FIG. 4b shows a cross-section of the PNPN semiconductor switch shown in FIG. 4c taken along a line IVa—IVa;

FIG. 4c is a plan view of the PNPN semiconductor element shown in FIGS. 4a and 4b; and FIG. 5 is a sectional view of a modified element.

DESCRIPTION OF THE PREFERRED EMBODIMENT

A preferred embodiment of this invention will now be described with reference to FIGS. 4a, 4b and 4c which relate to a bidirectional PNPN semiconductor switch.

The PNPN semiconductor switch shown in FIGS. 4a, 4b and 4c comprises an ON type substrate 22 acting as an N gate, P type diffused regions 23, 24, 25 and 26, N type diffused regions 27, 28, 29 and 30, of which the regions 23 and 25 act as anode regions, 24 and 26 as P gate regions, 27 and 29 as cathode regions, and 25 and 30 as drain regions, high resistance bodies 31 and 32 made of N type polycrystalline silicon and acting as gate electrodes, insulating films 33, semi-insulating films 34, aluminum electrodes 35, 35a, 36, 36a, 37 and 38 of which electrodes 35 and 35a act as anode electrodes, 36 and 36a as cathode electrodes and 37 and 38 as gate electrodes, electrodes 36c and 36d acting as gate electrodes, input terminals 39 and 40 and a luminous diode 41.

High resistance regions 42 and 43 are provided to connect gate electrodes 31 and 32 to cathode electrodes 37 and 38. Insulating layers 44 and 46 overlying gate electrodes 31 and 32 act as capacitors. In the same manner, insulating layers 45 and 47 respectively sandwiched between the gate electrodes 31, 32 and the cathode and drain regions 27, 29 and 28, 30 also act as capacitors. The surface of a portion of the P type diffused layers 24 and 26 which act as P gate surfaces immediately beneath the insulating layer 45 and sandwiched between the N type cathode region 27 and the N type drain region 28 is designated as a channel 48, while a P type diffused layer immediately beneath the insulating film 47 acting as a capacitor and sandwiched between N type cathode region 29 and the drain region 30 is also designated as a channel 49. A portion of the P gate region 24, whose resistance has been increased by modifying its shape, is designated as a resistor 50 whereas a portion of the P gate region 26, whose resistance has been increased by modifying its configuration, is designated as a resistor 51.

A gate electrode 37 is provided for electrically coupling the P type gate region 24, the N type drain region 28 and one end of the resistor 42, whereas the gate electrode 38 is provided for electrically coupling the P type gate region 26, the N type drain region 30 and one end of the resistor 43. The electrode 35 is electrically connected to the P type anode region 23, the N type diffused layer, that is cathode region 29 and one end of the resistor 51 and also acts as one electrode of the capacitor between gate electrodes 36b and 32. The electrode 36 is electrically connected to the P type diffused layer or anode region 25, and to the N type cathode region 27 and also acts as one electrode of the capacitor between gate electrodes 36c and 31. It should be understood that the P gate regions 26 and 24 are separated sufficiently.

In the switch of this invention, when terminal 39 is at a higher potential than the terminal 40, actuation of the luminous element 41 causes the PNPN element constituted by the P type anode region 23, the N type substrate 22, the P type gate region 24 and the N type cathode region 27 to become conductive.

In the absence of the light emitted by the luminous element, application of a potential to terminal 40 which builds up more rapidly than the potential applied to terminal 39 causes misoperation of a conventional PNPN element not provided with a dV/dt erroneous operation preventing circuit. In contrast, with the switch of this invention when a voltage which rapidly increases in the forward direction is applied to terminal 39, the high voltage would also be applied to the electrode 35 which is connected to the capacitor constituted by gate insulating layer 44. At this time, the potential $V_o$ of the gate electrode 31 sandwiched between insulating layers 44 and 45 rises to a potential determined by the capacitance therebetween and the resistor 42. The gate electrode 31, the insulating layer 45, the N type cathode and drain regions 27 and 28 and the channel 48 constitute a MOS field effect transistor, and as the potential of the gate electrode 31 becomes higher than the threshold voltage $V_T$ of the MOS field effect transistor, forming an inversion layer in the channel 48.

Then, the transient current created at the PN junction formed between the P type diffused layer 24 and the N type substrate 22 and reversely biased by the rapidly building up voltage does not pass through a PN junction between the P type diffused layer 24 and the N type diffused layer 27 but passes through the P type diffused region 24, electrode 37, N type diffused layer 28, channel 48, N type diffused layer 27 and electrode 36 without triggering the PNPN element. Upon termination of the transient input, the potential of the conductor 31 decreases gradually with a time constant determined by the capacitance provided by the insulating layer 45 and the resistor 42 until the potential finally becomes equal to the potential of the P type diffused layer 24, whereby the inversion layer in channel 48 disappears.

As described above, the element of this invention can absorb transient current by utilizing the variation in the potential of the gate electrode 31. The variation with time of the potential $V_o(t)$ of the gate electrode 31 can be expressed by the following equations:
When $0 \leq t < TR$ $$V_o(t) = RC_1 \frac{V_a}{tr} (1 - e^{-\frac{t}{R(C1+C2)}})$$

when $tr \leq t$ $$V_o(t) = RC_1 \frac{V_a}{tr} \{e^{-\frac{t-tr}{R(C1+C2)}} - e^{-\frac{t}{R(C1+C2)}}\}$$

where tr represents the building up time of the potential of terminal 39, $V_a$ the built up voltage, $C_1$ the capacitance provided by the insulating layer 44, $C_2$ the capacitance provided by the insulating layer 45, R the resistance value of the resistor 42, and the potential of terminal 40 is equal to the ground potential.

While the potential $V_o(t)$ is higher than the threshold voltage $V_T$, the transient current would be absorbed by flowing through channel 48. Where the value $RC_1$ is made close to or slightly larger than tr, it is possible to obtain a sufficiently large $V_o(t)$ necessary for the threshold voltage $V_T$. Moreover, it is possible to maintain the transient current absorbing capability for a sufficiently long interval subsequent to the building up of the input voltage. In addition, according to this invention, it is possible to select any value for the resistor 42.

The threshold voltage $V_T$ is determined by the thickness of the insulating layer 45 and gives an influence upon the dV/dt erroneous operation preventing capability; however, it is possible to provide an adequate erroneous operation preventing capability by suitably varying the ratio of the thicknesses of the insulating layers 44 and 45, because a PNPN element with the resistor 50 connected between its gate and cathode regions does not misoperate for a low built up voltage or for a slowly building up input waveform.

When the switch is driven by the luminous element 41, initiated by applying constant DC voltage or low frequency AC voltage across terminals 39 and 40, if the terminal 39 is at a higher potential than the terminal 40, the gate electrode 31 would be at the same potential as the P gate region 24 due to the presence of resistor 42 so that an inversion layer would not be formed in the channel 48. Consequently, all of the photocurrent created at the PN junction between the P gate region 24 and the N type substrate 22 and reversely biased by the light from the luminous element 41 flows through a PN junction between the P gate region 24 and the N type cathode region 27 and acts as the trigger current for the PNPN element. In this manner, the photosensitivity of this switch is determined by resistor 50, thus avoiding a decrease in the photosensitivity caused by the addition of the dV/dt erroneous operation preventing function.

As the switch is bidirectional, the photodriving and the dV/dt erroneous operation prevention function, when the potential of terminal 40 is higher than that of terminal 39, are the same as those described above. In this case, the P type anode region 23 is replaced by region 25, the P gate region 24 by region 26, the N type cathode region 27 by cathode region 29, the N type drain region 28 by drain region 30, the electrode 35 by 36, electrode 36 by 35, the electrode 37 by 38, the conductor gate electrode 31 by gate electrode 32, the resistor 42 by 43, the resistor 50 by resistor 51, the insulating layer 44 by 46, the insulating layers 45 by 47 and the channel 48 by 49.

The purpose of the semi-insulator film 34 is to prevent punch through of the P type diffused layers 23 and 24, and 25 and 26, caused by the voltage across electrodes 35 and 36.

Instead of using resistors 50 and 51, formed by a portion of the P type diffused layer, a polycrystalline silicon layer may be formed on the surface of the insulating layer 33 and by electrically connecting the opposite ends of the polycrystalline silicon layer to electrodes 37 and 36 and to electrodes 38 and 35, respectively. By connecting input terminals to the electrodes 37 and 38, the switch acts as a current drive type PNPN semiconductor switch with the same dV/dt erroneous operation preventing capability.

As above described, according to the first embodiment of this invention, for the purpose of preventing dV/dt erroneous operation of the PNPN element, an N type diffused layer different from a cathode region and maintained at the same potential as the gate electrode is formed therein, and the N type diffused layer and the cathode region are arranged to be short circuited by a MOS driven channel so that this channel is short circuited only when a rapidly building up voltage is applied to the anode electrode. Where constant voltage or low frequency AC voltage is applied across the two terminals of the switch, the channel would not be formed since the gate and drain electrodes are at the same potential, thus preserving the high gate sensitivity of the PNPN element. Thus the invention provides a photo PNPN semiconductor switch which satisfies the requirements of high gain and high dV/dt durability.

Moreover, as the dV/dt erroneous operation preventing circuit is fabricated in the PNPN element and on the surface thereof, the area of the element is nearly equal to that of a PNPN element having no erroneous operation preventing capability. Further element isolation is not necessary in both cases where the switch is either a unidirectional or a bidirectional type. When irradiating the switch with the luminous element, the entire surface of the chip can be irradiated without any accompanying problem, so that the switch can be fabricated with integrated circuit components, thus facilitating its fabrication.

The dV/dt erroneous preventing function of this invention is also effective for a PNPN semiconductor switch utilizing a current drive type PNPN element.

FIG. 5 illustrates the second embodiment of this invention having improved breakdown strength of the switch. FIG. 5 shows only one half of a bidirectional switch. The semiconductor switch shown in FIG. 5 comprises an N type substrate 22, a P type diffused layer 23 acting as an anode region, N type diffused layers 27 and 28 acting as cathode and drain regions respectively, a gate electrode 31, an insulating film 33, electrodes 35, 36 and 37, a semi-insulator film 24, terminals 39 and 40, resistors 42 and 50, insulating layers 44 and 45 both acting as capacitors and a channel 48, all being identical to those of the first embodiment. The P type diffused layer 24 comprises a layer 52 having a high surface concentration and a deep junction and a layer 53 having a low surface concentration and a shallow junction. To increase the breakdown voltage of the element, it is necessary to increase the thickness of the insulating film acting as the capacitor, but if the ratio between the thicknesses of the insulating films 44 and 45, acting as capacitors, were too large, it would become impossible to apply sufficient potential to conductor 31 necessary to prevent dV/dt erroneous operation which requires a very low impurity concentration in the P type surface of the channel 48. On the contrary, too low a surface concentration of the P type diffused layer 24 makes it difficult to provide ohmic contact for the electrode 37. For this reason, it is possible to obtain a photo PNPN semiconductor switch having a low threshold voltage and a high breakdown voltage by firstly diffusing a P type impurity at a high density into the portion of a region except channel 48 and then diffusing a P type impurity at a low density into the entire surface of the P type diffused layer. This second embodiment has the same advantages as the first embodiment, that is, a high dV/dt durability, a high gate sensitivity, a high degree of integration and ease of fabrication.

For this reason, the PNPN semiconductor switch is suitable for use as a crosspoint switch of a telephone speech path and many other switches.

What is claimed is:

1. A PNPN semiconductor switch comprising:
    (a) an N conductivity type semiconductor substrate,
    (b) a P conductivity type P gate region,
    (c) a P conductivity type anode region formed in said semiconductor substrate at a position which is a predetermined distance from said P gate region,
    (d) an N conductivity type cathode region formed in said P gate region,
    (e) an N conductivity type drain region formed in said P gate region at a position which is spaced from said N conductivity type cathode region,
    (f) a first insulating layer formed on the surface of said substrate between said cathode region and said drain region,
    (g) a first gate electrode formed on said first gate insulating layer,
    (h) a second gate insulating layer formed on said first gate electrode,
    (i) a third insulating layer formed on the surface of said substrate between said anode region and said P gate region,
    (j) a P gate electrode electrically connected to said drain region and said P gate region,
    (k) a resistance region connected between said first gate electrode and said P gate electrode,
    (l) a second gate electrode mounted on said second gate insulating layer,
    (m) a cathode electrode electrically connected to said cathode region, and
    (n) an anode electrode electrically connected to said anode region.

2. The PNPN semiconductor switch according to claim 1, wherein said first gate electrode and said resistance region are made of polycrystalline silicon.

3. The PNPN semiconductor switch according to claim 1, wherein said anode electrode and said second gate electrode are connected to input terminals.

4. The PNPN semiconductor switch according to claim 1, which further comprises a semi-insulating layer located between said anode region and said P gate region and between the surface of said substrate and said third insulating layer.

5. The PNPN semiconductor switch according to claim 1, wherein the impurity concentration of a P type region between said cathode region and said drain region is lower than that of said P gate region.

6. A bidirectional PNPN semiconductor switch comprising:
    (a) an N type semiconductor substrate,
    (b) a first P gate region of P type conductivity formed in said N type substrate,
    (c) a first anode region formed in said substrate at a position which is a predetermined distance apart from said first P gate region,
    (d) a first cathode region of N conductivity type formed in said first P gate region,
    (e) a first drain electrode formed in said first P gate region at a position which is a predetermined distance apart from said first cathode region,
    (f) a first gate insulating layer disposed on the surface of said substrate between said first cathode region and said first drain region,
    (g) a first gate electrode disposed on said first gate insulating layer,
    (h) a second gate insulating layer disposed on said first gate electrode,
    (i) a first insulating layer mounted on the surface of said substrate between said first anode region and said first P gate region,
    (j) a first P gate electrode electrically connected to said first drain region and said first P gate region,
    (k) a first resistance region electrically connected between said first gate electrode and said first P gate electrode, (l) a second gate electrode mounted on said second gate insulating layer, (m) a first cathode electrode electrically connected to said first cathode electrode, (n) a first anode electrode electrically connected to said first anode electrode, (o) a second P gate region formed in said substrate at a position which is a predetermined distance apart from said first P gate region, (p) a second anode region of P conductivity type formed at a position of said substrate which is a predetermined distance apart from said second P gate region, (q) a second cathode region of N conductivity type formed in said second P gate region, (r) a second drain region of N conductivity type formed in said second P gate region at a predetermined distance apart from said second cathode region, (s) a third gate insulating layer mounted on the surface of said substrate between said second substrate and said second drain region, (t) a third gate electrode mounted on said third gate electrode layer, (u) a fourth gate electrode layer mounted on said third gate electrode, (v) a second insulating layer formed on the surface of said substrate between said second anode region and said second P gate region, (w) a second P gate electrode electrically connected to said second drain electrode and said second P gate region, (x) a second resistance region electrically connected between said third gate electrode and said second P gate electrode, (y) a fourth gate electrode mounted on said fourth gate insulating layer, (z) a second cathode electrode electrically connected to said second cathode region, (A) a second anode electrode electrically connected to said second anode region, and (B) a third insulating region formed on the surface of said semiconductor substrate between said first P gate region and said second P gate region.

7. The bidirectional PNPN semiconductor switch according to claim 6, wherein said first and third gate electrodes and said first and second resistance regions are made of polycrystalline silicon.

8. The bidirectional PNPN semiconductor switch according to claim 6, wherein said first anode electrode, said second gate electrode and said second anode electrode are connected to a first terminal, and wherein said first cathode electrode, said fourth gate electrode and said second anode electrode are connected to a second terminal.

9. The bidirectional PNPN semiconductor switch according to claim 6, which further comprises a first semi-insulating layer located between said first anode region and said first P gate region and sandwiched between the surface of said substrate and said first insulating layer, a second semi-insulating layer located between said first P gate region and said sandwiched between said third insulating layer and the surface of said substrate, and a third semi-insulating layer located between said second P gate region and said second anode region and sandwiched between said second insulating layer and the surface of said substrate.

10. The bidirectional PNPN semiconductor switch according to claim 6, which further comprises a luminous element which illuminate said first or second P gate region.

* * * * *